(12) United States Patent
Novichkov et al.

(10) Patent No.: US 7,617,432 B2
(45) Date of Patent: Nov. 10, 2009

(54) HIERARCHICAL DESIGN AND LAYOUT OPTIMIZATIONS FOR HIGH THROUGHPUT PARALLEL LDPC DECODERS

(75) Inventors: Vladimir Novichkov, Towaco, NJ (US); Tom Richardson, South Orange, NJ (US); Vince Loncke, Jersey City, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 1268 days.

(21) Appl. No.: 10/985,475

(22) Filed: Nov. 10, 2004

(65) Prior Publication Data

US 2006/0117240 A1    Jun. 1, 2006

(51) Int. Cl.
*H03M 13/11* (2006.01)
(52) U.S. Cl. ...................... 714/752; 714/804
(58) Field of Classification Search ................. 714/752, 714/804
See application file for complete search history.

(56) References Cited

U.S. PATENT DOCUMENTS 6,938,196 B2*    8/2005   Richardson et al. ......... 714/752
7,376,885 B2*    5/2008   Richardson et al. ......... 714/758

\* cited by examiner

*Primary Examiner*—Scott T Baderman
*Assistant Examiner*—Sam Rizk
(74) *Attorney, Agent, or Firm*—Michael P. Straub; James K. O'Hare

(57) ABSTRACT

High throughput parallel LDPC decoders are designed and implemented using hierarchical design and layout optimization. In a first level of hierarchy, the node processors are grouped on the LDPC decoder chip, physically co-locating the processing elements in a small area. In a second level of hierarchy, clusters, e.g., subsets, of the processing elements are grouped together and a pipeline stage including pipeline registers is introduced on the boundaries between clusters. Register to register path propagating signals are keep localized as much as possible. The switching fabric coupling the node processors with edge message memory is partitioned into separate switches. Each separate switch is split into combinational switching layers. Design hierarchies are created for each layer, localizing the area where the interconnect is dense and resulting in short interconnect paths thus limiting signal delays in routing.

1 Claim, 2 Drawing Sheets

HIERARCHICAL DESIGN AND LAYOUT OPTIMIZATIONS FOR HIGH THROUGHPUT PARALLEL LDPC DECODERS

FIELD OF THE INVENTION

The present invention relates to improved decoder design methods and improved decoder apparatus and, more particularly, to hierarchical design and layout optimizations for high throughput low density parity check (LDPC) decoders.

BACKGROUND OF THE INVENTION

Nearly all forms of electronic communication and storage systems use error-correcting codes. Error correcting codes compensate for the intrinsic unreliability of information transfer in these systems by introducing redundancy into the data stream. Recent advances in error correcting coding systems resulting from the subsequent rediscovery and development of low-density parity-check (LDPC) codes offer coding systems of feasible complexity that can approach Shannon's capacity quite closely. The use of LDPC decoders is increasing, and there is a need for improved decoder design methods and decoder implementations. Improved design methods for LDPC decoders that optimize layout and provide for high throughput would be advantageous.

SUMMARY OF THE INVENTION

The invention is directed to methods and apparatus for implementing LDPC decoders using a flexible pipeline structure that allows for very high clock rates in both variable and check node update computations as well as the switching fabric. Additionally the invention is directed to some novel IDPC code design together with some decoder architecture that allows for a high degree of parallelism in decoder implementation. An LDPC decoder can use both features of the invention simultaneously in order to achieve a low cost and very high throughput design.

In a scalar LDPC decoder design the individual gate delays in check and variable node computations and memory access time determine the highest design frequency. As the decoder parallelism increases the silicon area occupied by the design normally grows nearly proportionally and the interconnect delay becomes the dominant factor determining maximum attainable design clock speed.

It is therefore highly desirable to geometrically localize the computations that require combinatorial logic within an immediate neighborhood as well as carefully plan interconnect topology and signal loading. While current generation of VLSI synthesis and floor planning tools usually do a great job of local optimizations they are much less efficient in understanding and using large scale interconnect topology specifics of a design as done to achieve the structures of the present invention.

A high performance decoder may be comprised of several hundred or even thousands of variable and check node processing elements, multiple switching fabrics and memories. The decoder data flow or dependency graph and a corresponding design netlist (which is also a graph) while being relatively sparse has very complex topology. The optimal layout problem posed for such a graph corresponding to N processors is generally Nxharder than the optimal layout problem associated with a single processor, and current design tool heuristics are usually not sophisticated enough to recognize patterns and structure at the overall design level. The apparatus of the present invention take advantage of decoder interconnect topology and can take advantage of non-trivial design properties as well as change the design in the way existing automated design tools are not capable of and thereby provide a higher performing design.

Vectorized LDPC decoder design is highly structured fine-grained and therefore has a lot of potential for joint design-layout optimizations. The subject of current invention is a set of layout and layout-related design methods for improving clock frequency, reducing area and lowering power consumption of a highly parallel LDPC decoder. The present invention is also directed to LDPC decoders which have been implemented in accordance with layouts following the design methods of the present invention.

High throughput parallel LDPC decoders are designed and implemented using a hierarchical design and layout optimization in accordance with the methods of the present invention. In a first level of hierarchy, the node processors are grouped on the LDPC decoder chip, physically co-locating the processing elements in a small area. In a second level of hierarchy, clusters, e.g., subsets, of the processing elements are grouped together and a pipeline stage including pipeline registers is introduced on the boundaries between clusters. Register to register path propagating signals are keep localized as much as possible. The switching fabric coupling the node processors with edge message memory is partitioned, in accordance with the invention, into separate switches. Each separate switch is split into combinational switching layers. Design hierarchies are created for each layer, localizing the area corresponding to a switching layer so that the interconnect within and between layers is dense resulting in short interconnect paths thus limiting signal delays in routing. LDPC codes with multi-level factorable permutations are advantageously taken advantage of, in accordance with the present invention, by grouping switch layers into sub-levels according to a permutation group structure relating to message reordering operations performed during decoding. This switching separation into sub-levels and the corresponding physical layout implemented increases interconnect localization again resulting in reduced switching signal paths, reducing delays, and providing improved performance over other less structured implementations.

In accordance with the invention, the hierarchical structure facilitates different types of busses, e.g., global interconnect bus, a bus used for connecting clusters within the decoder, etc. In accordance with one feature of the invention, a portion of a variable node processing element bus, e.g., control bus, is shared on a time shared basis by individual node processing elements within a variable node processing element block.

Numerous additional features and benefits are described in the detailed description which follows.

BRIEF DESCRIPTION OF THE FIGURES

FIG. 1 also illustrates clustering of nodes and methods of hierarchical clustering in accordance with the present invention.

DETAILED DESCRIPTION OF THE INVENTION

The following (3) related applications are hereby expressly incorporated by reference and are to be considered part of the present application: U.S. patent application Ser. No. 09/975, 331 filed Oct. 10, 2001 entitled "METHODS AND APPARATUS FOR DECODING LDPC CODES", U.S. patent application Ser. No. 10/117,264 filed Apr. 4, 2002 entitled "NODE PROCESSORS FOR USE IN PARITY CHECK DECODERS", and U.S. patent application Ser. No. 10/618, 325 filed Jul. 11, 2003 entitled "METHODS AND APPARATUS FOR ENCODING LDPC CODES".

Figure 1:
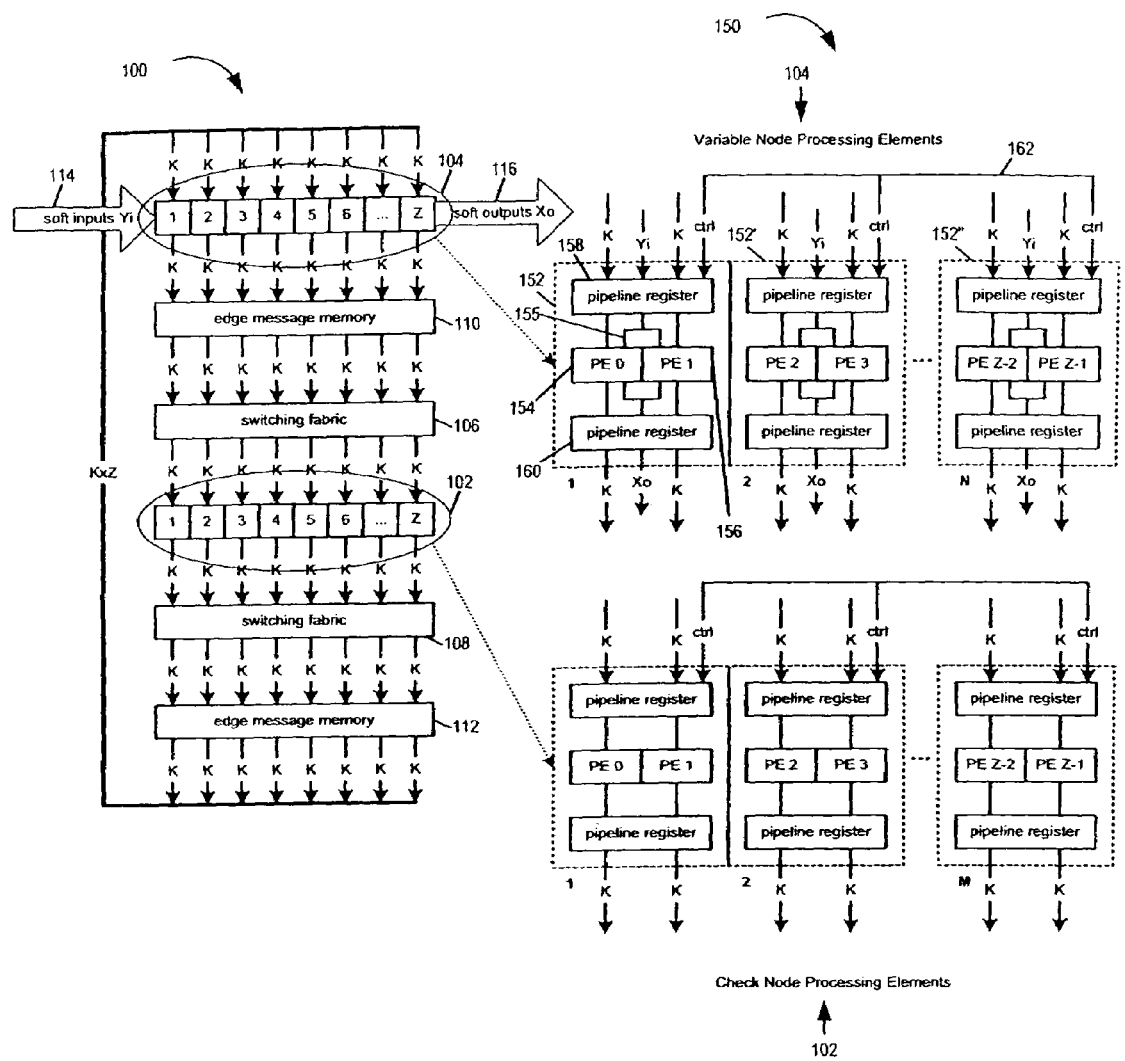
FIG. 1 is a drawing of an exemplary LDPC processor used in an exemplary LPDC decoder in accordance with the present invention.

FIG. 1 includes a drawing of an exemplary Z-wide vector LDPC processor 100 that may be used in an exemplary LDPC decoder in accordance with the present invention. Consider a Z-wide vector LDPC processor 100 with Z check node processing elements 102 and Z variable node processing elements 104. Additionally such a processor 100 includes 2 switching fabrics 106, 108 of Z×K bits wide data path where K is the number of bits in the edge message for given quantization rule. Soft input values Yi 114 are received as input by the variable node processing elements 104, while soft outputs Xo 116 are output from the variable node processing elements 104.

Edge message memory 110 is coupled to the output of the variable node processing elements 104 and to the input of switching fabric 106. The output of the switching fabric 106 is coupled to the input of the check node processing elements 102. The output of the check node processing elements 102 is coupled to the input of the switching fabric 108, and the output of the switching fabric 108 is coupled to the input of edge message memory 112. The output of edge message memory 112 is coupled to an input of the variable node processing elements 104.

An exemplary method of hierarchical clustering of node processing elements in accordance with the present invention shall now be described.

The method includes creating a level of design hierarchy for variable and check node processing elements that encapsulate each of the node computations within the boundary of hierarchical instance. The processing requiring multiple levels of combinatorial logic is encapsulated within instance boundaries.

The method also includes creating one or more levels of additional design hierarchy to cluster groups of N processing nodes (check or variable) together and pipelining both data path and control signals at the cluster boundary. The cluster comprised of N processing nodes and corresponding pipeline registers defines a new design block such that each individual instance of that block that can be individually floorplanned. Drawing 150 illustrates processing nodes being grouped into blocks of two. Exemplary variable node processing element block 152 includes processing element 0 154, processing element 1 156, an input pipeline register 158, and an output pipeline register 160 grouped together. Control signals 162 connect to each of the variable node processing element blocks (152, 152', 152"). In accordance with one feature of the invention, a portion of a variable node processing element bus 155, e.g., control bus, is shared on a time shared basis by individual node processing elements (154, 156) within the variable node processing element block 152. In drawing 150, Z variable processing nodes are grouped into N=(Z/2) blocks (152, 152', 152"), while Z check node processing nodes are grouped into M=(Z/2) blocks. In general, the number of check nodes and variable nodes may be different and the number of variable nodes grouped in a variable node block may be different that the number of check nodes grouped in a check node block.

For very large designs several levels of hierarchy can be introduced. For example clusters containing N processing nodes can be grouped into level 2 clusters encapsulating M level 1 clusters and so on. At each clustering level each of the signals with high loading are re-buffered and optionally re-pipelined. Variable node cluster size N, check node cluster size M and the number of clustering levels depends on total parallelism factor Z and target technology process and library capabilities.

In some decoder structures where soft input and output data buses can be time shared across multiple system clock cycles there is an additional benefit of clustering variable node processors that share the same input/output bus. This way an input/output data pipeline stage inside the cluster can be shared across multiple processing nodes.

Figure 2:
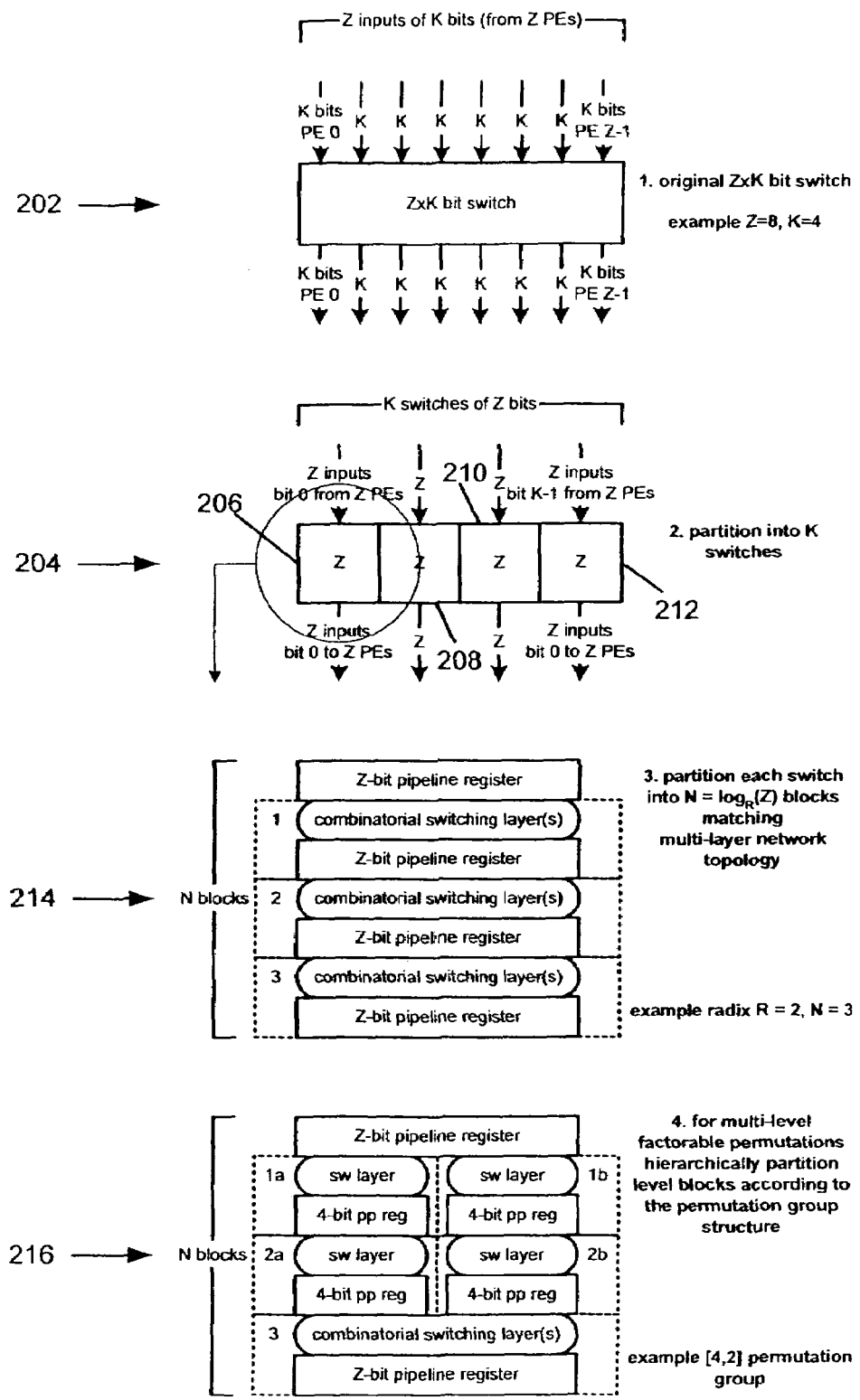
FIG. 2 includes drawings used to illustrate exemplary switch partition and partitioning methods in accordance with the present invention.

Permutation switching fabric layout optimization will now be described in accordance with the methods of the present invention. FIG. 2 includes drawings used to illustrate exemplary switch partition and partitioning methods in accordance with the present invention. Typically the switching fabric used in some vector LDPC decoders is a multi-layer log-shifter or shuffle type network. Interconnects in such a network can not be topologically sorted in a two-dimensional plane therefore interconnects can not be completely localized. It is possible however, in accordance with the invention, to encapsulate sections of the switch design and reduce areas of dense interconnect to small regions thus saving power consumption and reducing delay substantially. The following steps can be taken to optimize switch layout.

Partition a Z×K bit wide switching fabric (where Z denotes LDPC decoder parallelism and K denotes message resolution in bits) into K independent Z×1 switching fabric blocks. Drawing 202 illustrates an exemplary original (pre-partition) Z×K bit switch for the example where Z=8, K=4. Drawing 204 illustrates K switches (206, 208, 210, 212) of Z bits, representing the partition of the original switch of drawing 202. There is no data exchange between the Z×1 switches (206, 208, 210, 212) therefore all interconnections (except some control lines) will be local to the individual Z×1 switches (206, 208, 210, 212).

Partition individual switches (206, 208, 210, 212) by switching network layers and creating corresponding design hierarchy. A high performance switch implementation would have $N=\log_R(Z)$ radix R combinatorial switching layers interleaved with pipeline stages (the ratio of the number of pipeline stages to the number of combinatorial switching layers is determined by target performance). Encapsulating individual layers into design hierarchy blocks further localizes interconnect because each block corresponding to a network layer is connected only to two neighbors and the dense interconnect is grouped inside the block. Drawing 214 illustrates an exemplary partition of switch 206 into $N=\log_R(Z)$ blocks matching the multi-layer network topology for radix R=2 and N=3.

LDPC codes using multi-level factorable permutation groups can further benefit from intra-level switch partitioning. A multi-level cyclic permutation group can be defined as a sequence of L factors [U, V, W . . . ] such that cyclic permutation is nested L times having modulo U cyclic permutation at the lowest level replicated V times followed by modulo V permutation, this structure in itself is replicated W times and followed by modulo W permutation and so on. For Z=8 permutation group [4,2] defines 2 cyclic permutations of size 4 followed by a modulo 2 exchange between two lower level (size 4) permutations. A design complexity and number of layers in a nested [4,2] cyclic permutation fabric is similar to a single modulo 8 permutation fabric however there is no interconnect between to inner size 4 stages and they can be partitioned into separate hierarchical blocks. In a similar way this process can be extended to more than one level of nesting. Drawing 216 is an illustration of an exemplary partition for multi-level factorable permutations, where the partition includes level blocks according to the permutation group structure shown for the exemplary [4,2] permutation group.

One can parametric synthesize pipeline registers in the switching fabric.

Top level data flow driven layout optimization will now be described, in accordance with the present invention.

The design method includes pipelining each of the signals at the interface level of each decoder core top level block. For a single level clustered decoder the top level is comprised of Z/N variable node processing blocks (where Z is the total number of variable node and N is the number of variable nodes clustered in a single variable node processing block), Z/M check node processing blocks (where Z is the total number of check nodes and M is the number of check nodes clustered in a single check node processing block), switching fabric blocks grouped as described above with respect to FIG. 2, memories and a control block. If each of the interface signals of individual blocks are pipelined and each of the individual block instances are floorplanned as contiguous (and preferably convex with low boundary length to area ratio) regions to maintain geometrical interconnect locality within each instance then the slow top level interconnect (encapsulating longest core-size traces) will carry only inter-block signals with most of the clock period allocated for signal propagation. Signal flow can be optimized for the top layout of the LDPC decoder. A clock tree can be synthesized in accordance with the top layout of the LDPC decoder.

What is claimed is:

1. An apparatus for performing a low density parity check decoding operation, the apparatus includes:

a hierarchical arrangement of variable node processing elements, said first hierarchical arrangement including variable node processing elements arranged into a plurality of first clusters, the variable node processing elements in each of said first clusters having in common at least a portion of a bus that is shared by the processors in the cluster on a time shared basis, each cluster including at least one shared pipeline register, said first clusters arranged to form a second cluster, said second cluster being a cluster of said first clusters;

a hierarchical arrangement of check node processing elements, said hierarchical arrangement of check node processing elements including check node processing elements arranged into a plurality of first check node clusters which are arranged grouped together to form a higher level cluster; and a switching fabric for coupling said second cluster to said hierarchical arrangement of check node processors, said switching fabric being implemented as a series of multiple combinational switches coupled in series by pipeline registers.

* * * * *

UNITED STATES PATENT AND TRADEMARK OFFICE
CERTIFICATE OF CORRECTION

PATENT NO. : 7,617,432 B2 Page 1 of 1
APPLICATION NO. : 10/985475
DATED : November 10, 2009
INVENTOR(S) : Novichkov et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1400 days.

Signed and Sealed this

Nineteenth Day of October, 2010

David J. Kappos
*Director of the United States Patent and Trademark Office*